United States Patent [19]
Yang et al.

[11] Patent Number: 5,489,541
[45] Date of Patent: Feb. 6, 1996

[54] PROCESS OF FABRICATING A BIPOLAR JUNCTION TRANSISTOR

[75] Inventors: Sheng-Hsing Yang; Ying-Tzung Wang, both of Hsinchu, Taiwan

[73] Assignee: United Microelectronics Corporation, Hsinchu, Taiwan

[21] Appl. No.: 422,568

[22] Filed: Apr. 14, 1995

[51] Int. Cl.$^6$ ............................................. H01L 21/8222
[52] U.S. Cl. ........................... 437/31; 437/28; 437/154; 437/152; 148/DIG. 10
[58] Field of Search ................... 437/31, 32, 27, 437/28, 152, 154, 909; 148/DIG. 10

[56] References Cited

U.S. PATENT DOCUMENTS

| | | | |
|---|---|---|---|
| 4,839,302 | 6/1989 | Kameyama et al. | 437/31 |
| 5,188,972 | 2/1993 | Shum et al. | 437/31 |
| 5,279,976 | 1/1994 | Hayden et al. | 437/31 |
| 5,411,900 | 5/1995 | Nagel | 437/31 |

*Primary Examiner*—Tuan H. Nguyen
*Attorney, Agent, or Firm*—Townsend and Townsend and Crew

[57] ABSTRACT

A process of fabricating a bipolar junction transistor forms, on the substrate, a masking layer including an opening, an intermediate masking portion surrounded by the opening and an outer masking portion. The masking layer consists of a pad oxide and a silicon nitride. A photoresist is then formed on the outer masking portion. A first ion implantation process at a relatively low dose and a relatively high energy is performed to form a base region underlying the intermediate masking portion, and a second ion implantation process at a relatively high dose and a relatively low energy is performed to form a base contact region underlying the opening. Then, the photoresist is removed. A field oxide is grown in the opening of the masking layer, followed by removing the masking layer. A highly-doped polysilicon layer is deposited over the structure, and a rapid thermal annealing process is performed to diffuse the impurities within the polysilicon layer into the substrate to form an emitter region in the base region and to form a collector contact region, by using the field oxide as a mask.

12 Claims, 5 Drawing Sheets

5,489,541

PROCESS OF FABRICATING A BIPOLAR JUNCTION TRANSISTOR

BACKGROUND OF THE INVENTION

The present invention relates to an integrated circuit fabrication, and more particularly to a process of fabricating a self-aligned bipolar junction transistor (BJT) with a shallow base junction to achieve higher gain.

BJTs are well known in the integrated-circuit technical field. FIG. 1 shows a schematic cross-section of a conventional BJT. The BJT is fabricated in an N-type silicon substrate 1 which serves as the collector region of the BJT. A P-well 10 is diffused into the silicon substrate 1 to form the base region 10 of the BJT. An $N^+$-type diffusion region 12 is formed in the base region 10, and serves as the emitter region of the BJT. A $P^+$-type base contact. region 14 is diffused into the base region 10, and an $N^+$-type collector contact region 16 is formed in the silicon substrate 1.

In the conventional process of fabricating such BJTs, formation of the $N^+$ emitter region 12 and of the $P^+$ base contact region 14 in the P-well 10, i.e. the base region, is done by photolithography and implantation technologies. The P-well 10 has to occupy a surfrelent size to tolerate the mask misalignment problem. This prevents the efficient utilization of limited wafer size. Furthermore, the conventional process can not easily form a shallow junction for the base region 10, and thus it is difficult for the fabricated BJT to achieve higher gain.

SUMMARY OF THE INVENTION

The primary object of the present invention is to provide a process of fabricating a bipolar junction transistor. The fabricating process forms the emitter diffusion region of the BJT and the collector contact diffusion region in a self-aligned manner. The process also can form a shallow junction for the base diffusion region of the BJT to obtain higher gain.

In accordance with the present invention, a method for fabricating a bipolar junction transistor, comprises the following steps of:

(a) forming a first masking layer with an opening on a face of a substrate, the first masking layer including an intermediate masking portion surrounded by the opening and an outer masking portion;

(b) forming a second masking layer on the outer masking portion;

(c) ion implanting in the substrate a base region underlying the intermediate masking portion, and a base contact region underlying the opening;

(d) removing the second masking layer;

(e) forming an insulating region overlying the base contact region;

(f) removing the first masking layer;

(g) forming a highly-doped conductive layer over the structure; and (h) diffusing impurities within the conductive layer into the substrate to form an emitter region in the base region and to form a collector contact region, by using the insulating region as a mask.

In accordance with one aspect of the present invention, the step (c) comprises the steps of ion implantation at a relatively low dose and a relatively high energy to form the base region, and ion implantation at a relatively high dose and a relatively low energy to form the base contact region. The ion implantation for forming the base region may use boron or $BF_2$ ions with a dose of between about $2 \times 10^{12}$ to $2 \times 10^{14}$ atoms/cm$^2$ and an energy of between about 50 to 100 KeV; and wherein the ion implantation for forming the base contact region may use $BF_2$ ions with a dose higher than $1 \times 10^{15}$ atoms/cm$^2$ and an energy of between about 20 to 30 KeV. The base diffusion region has a junction depth shallower than the base contact diffusion region due to the blocking of the intermediate masking portion.

In accordance with another aspect of the present invention, the step (a) comprises the steps of forming by oxidation a pad oxide over the substrate; forming a silicon nitride over the pad oxide; and patterning the silicon nitride and pad oxide to complete the first masking-layer. Preferably, the pad oxide has a thickness of about 200–500 angstroms, and the silicon nitride has a thickness of about 1000–2000 angstroms. The second masking layer may be made from photoresist. The step (e) comprises the step of growing a field oxide in the opening of the first masking layer. Preferably, the field oxide has a thickness of between about 5000 to 20000 angstroms.

In accordance with further aspect of the present invention, the conductive layer may be made from polysilicon. The step (h) comprises the step of performing a rapid thermal annealing process to diffuse impurities from the polysilicon layer into the substrate regions which are not covered by the insulating region.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

The preferred embodiment of the present invention is illustrated in FIGS. 2(a) through 2(g) of the drawings with, like numerals being used to refer to like and corresponding parts of the various drawings. FIGS. 2(a)–(g) illustrate cross-sectional side views of the present invention throughout various processing stages.

First, a silicon material is provided. The silicon material may be a P-type or N-type silicon substrate, a P-type or N-type well, or an epitaxy layer. In this embodiment, the silicon material is an N-type silicon substrate 2 which serves as the collector region of the bipolar junction transistor of the present invention.

Figure 1:
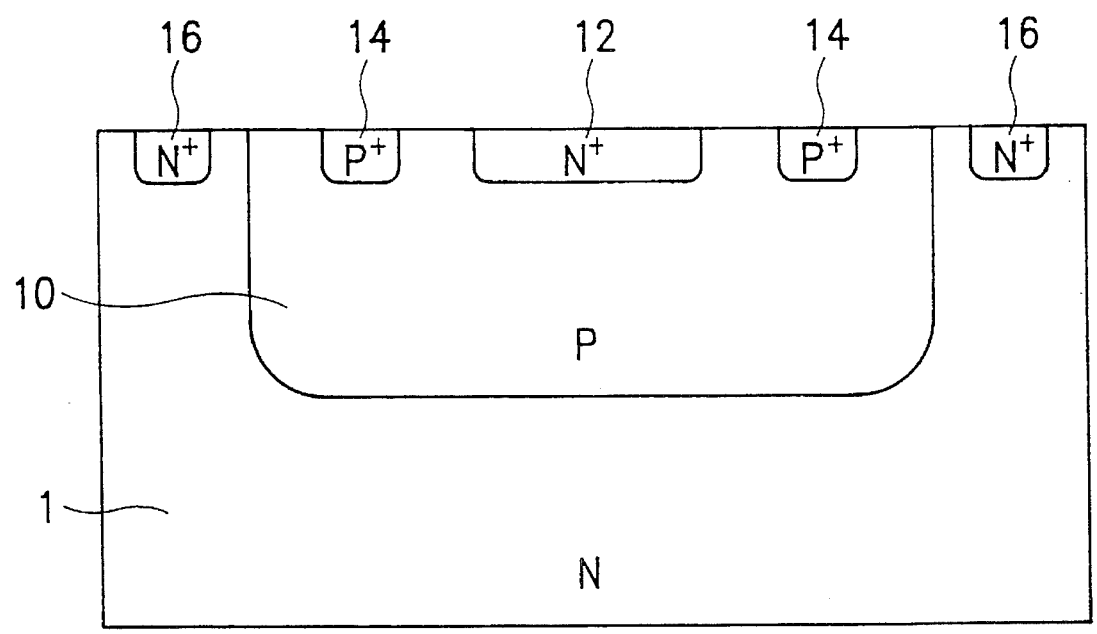
FIG. 1 illustrates a cross-sectional side view of a conventional bipolar junction transistor.
Figure 2A:
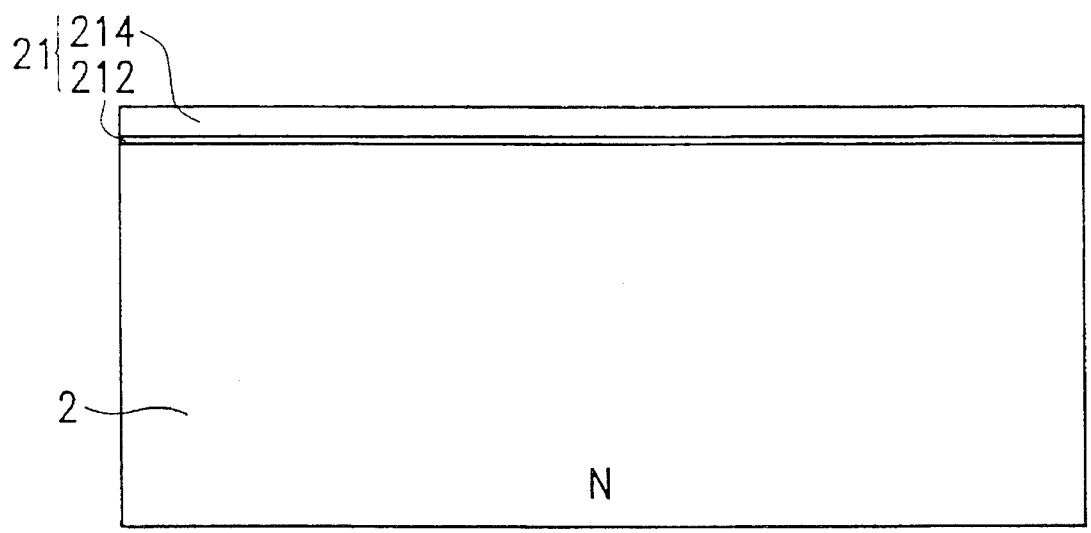
FIG. 2(a) illustrates a cross-sectional side view of a novel bipolar junction transistor after a first processing stage, according to one preferred embodiment of the present invention.

FIG. 2(a) illustrates a cross-sectional side view of the silicon substrate 2 after a first processing stage. A masking layer 21 is formed over the silicon substrate 2. In this embodiment, the masking layer 21 preferably comprises a pad oxide 212 formed over the silicon substrate 2, and a silicon nitride layer 214 deposited over the pad oxide 212. Typically, the pad oxide 212 is formed by thermal oxidation, and its thickness is preferably about 200– 500 angstroms. The thickness of the silicon nitride layer 214 is preferably about 1000–2000 angstroms.

Figure 2B:
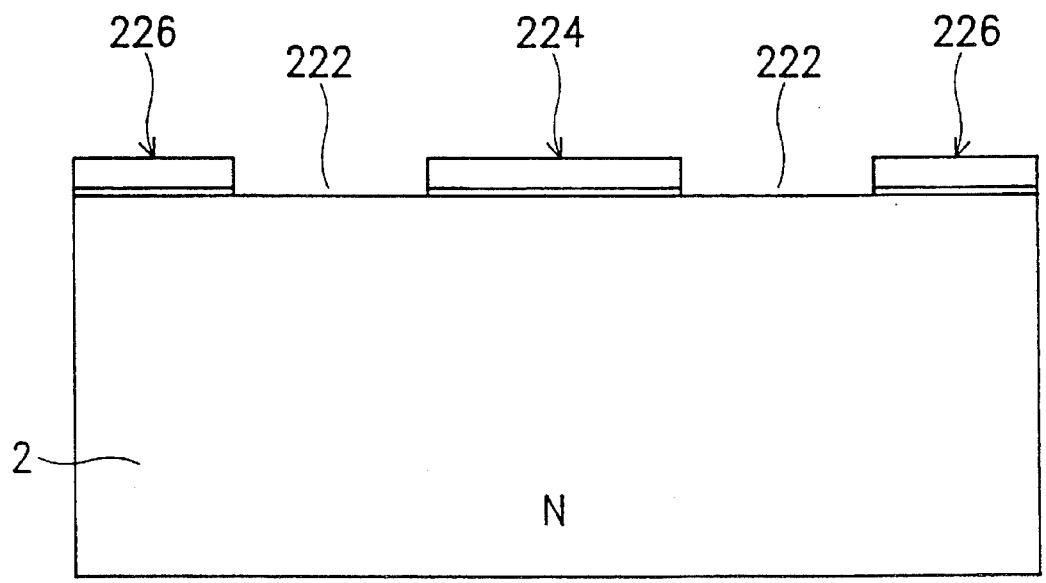
FIG. 2(b) illustrates a cross-sectional side view of the BJT of the present invention after a second processing stage.

FIG. 2(b) illustrates a cross-sectional side view of the present invention after a second processing stage. The masking layer 21 is patterned by conventional photolithography and etching technologies to form an opening 222 in the planned base contact region. After the opening 222 is formed, the remained masking layer 21 includes an intermediate masking portion 224 surrounded by the opening 222, and an outer masking portion 226.

Figure 2C:
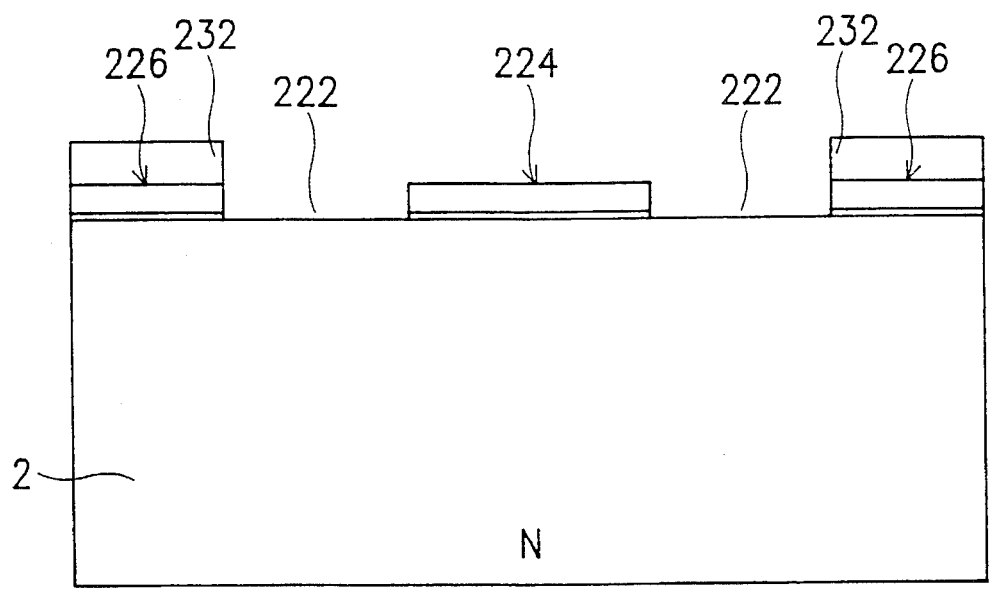
FIG. 2(c) illustrates a cross-sectional side view of the present invention after a third processing stage.

FIG. 2(c) illustrates a cross-sectional side view of the present invention following a third processing step. Another masking layer 232 is formed on the outer masking portion 226. Typically, the masking layer 232 is made from a developed photoresist layer.

Figure 2D:
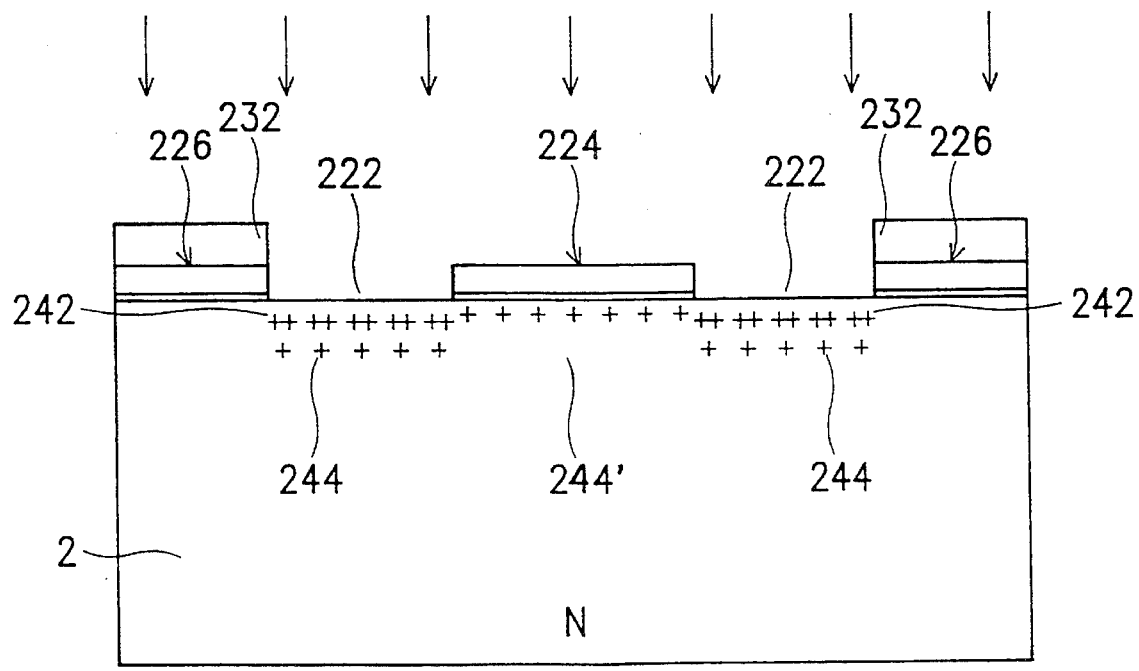
FIG. 2(d) illustrates a cross-sectional side view of the present invention after a fourth processing stage.

FIG. 2(d) illustrates a cross-sectional side view of the present invention after a fourth processing stage. Base and base contact ion implantations are performed in this stage to form the base and base contact regions. First, an ion implantation with a relatively high dose and a relatively low energy is used to introduce $P^+$-type impurities 242 in to the silicon substrate region underlying the opening 222 but not into the region underlying the intermediate masking portion 224. In this embodiment, $BF_2$ ions with a dose greater than approximately $1\times10^{15}$ atoms/cm$^2$ and an energy of between about 20 to 30 KeV, is used as the dopant. Then, an ion implantation with a relatively low dose add a relatively high energy is used to introduce P-type impurities 244 and 244' into the silicon substrate region underlying both the opening 222 and the intermediate masking portion 224. Due to the blocking of the intermediate masking portion 224, the implanted depth of impurities 244' is shallower than that of impurities 244, as shown in the drawing. In this embodiment, boron or $BF_2$ ions with a dose of between approximately $2\times10^{12}$ and $2\times10^{14}$ atoms/cm$^2$ and an energy of between approximately 50 and 100 KeV, is used as the dopant. Of course these two implantation steps can be reversed.

Figure 2E:
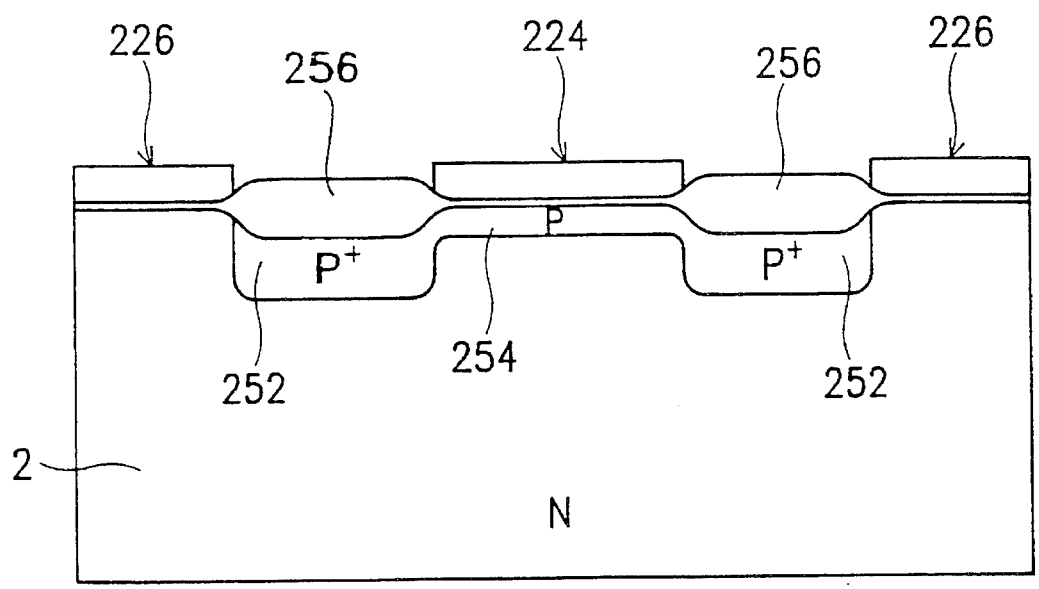
FIG. 2(e) illustrates a cross-sectional side view of the BJT of the present invention after a fifth processing stage.

FIG. 2(e) illustrates a cross-sectional side view of the present invention after a fifth processing stage. After ion implantations, the photoresist 232 is stripped away while the intermediate and outer masking portions 224 and 226 remain. An insulating region 256 is formed on the silicon substrate region in the opening 222. Typically, the insulating region 256 is formed by growing a field oxide on the silicon substrate 2, which has been masked by the masking portions 224 and 226 to prevent oxidation. In this embodiment, the field oxide 256 has a thickness of about 5000–12000 angstroms. This thermal oxidation cycle simultaneously drives in the impurities 242, 244 and 244' to form the deep $P^+$-type base contact diffusion region 252 and the shallow P-type base diffusion region 254. The formed shallow junction of the base region 254 can lead to an increase in gain of the BJT.

Figure 2F:
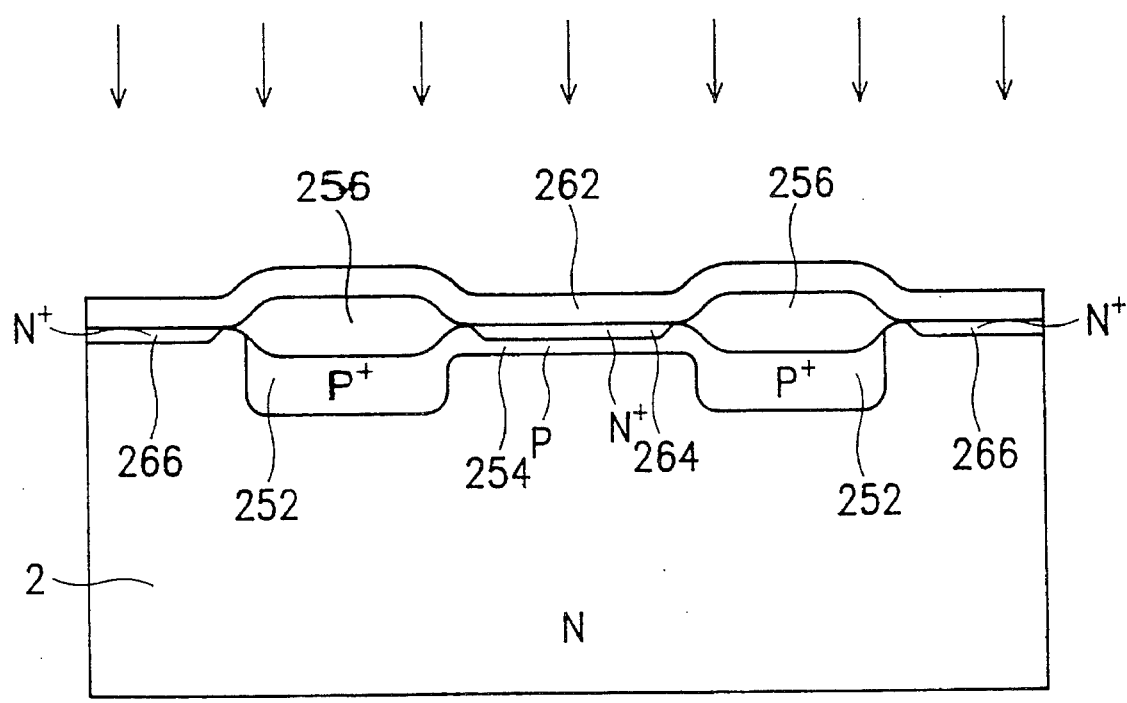
FIG. 2(f) illustrates a cross-sectional side view of the present invention after a sixth processing stage.

FIG. 2(f) illustrates a cross-sectional side view of the present invention following a sixth processing step. After formation of the field oxide 256, the masking layers 224 and 226 are removed by etch. A conductive layer 262 is deposited over the entire structure, and is highly doped by N-type impurities. Typically, the conductive layer 262 is made from polycrystalline silicon (or polysilicon). Then, a rapid thermal annealing (RTA) process is performed, causing diffusion of the N-type impurities from the polysilicon layer 262 into the silicon substrate regions not covered by the field oxide 256. Since the field oxide 256 is very thick, the impurities will not diffuse through the field oxide 256 into the silicon substrate 2. After KTA process, $N^+$ collector contact diffusion region 266 and $N^+$ emitter diffusion region 264 of the BJT are formed in the collector region 2 and the base region 254, respectively, in a self-aligned manner. In this manner, the base region 254 no longer needs to include an additionally tolerant size to compensate for the mask misalignment problems, as in the prior art. Therefore, the wafer size can be reduced in the present invention.

Figure 2G:
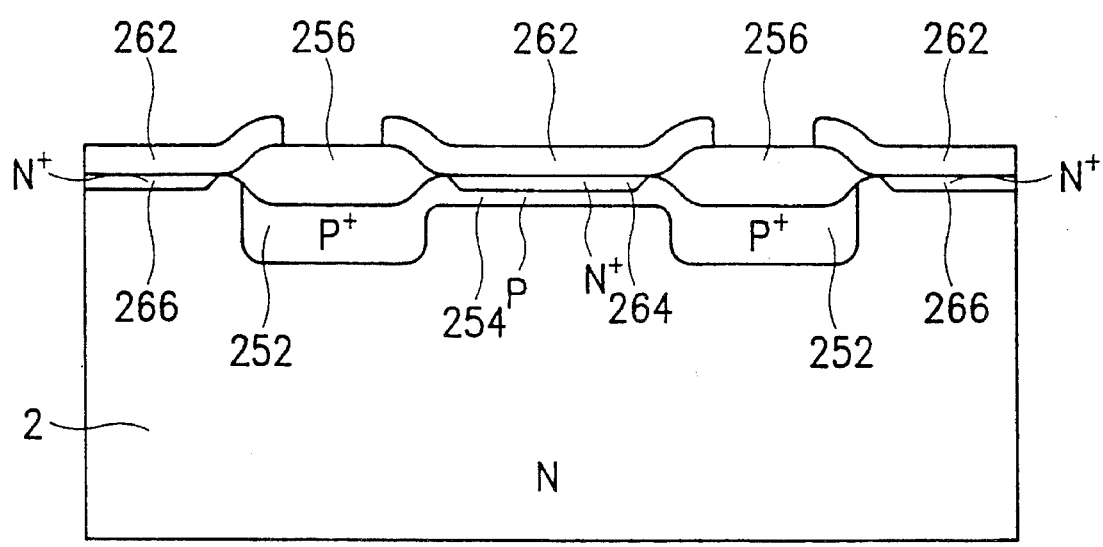
FIG. 2(g) illustrates a cross-sectional side view of the BJT of the present invention after a seventh processing stage.

FIG. 2(g) illustrates a cross-sectional side view of the present invention after a seventh processing stage. The polysilicon layer 262 is patterned by conventional photolithography and etching technologies to complete the desired contact configuration for the emitter region 264 and the collector contact region 266. As shown in the drawing, most of the polysilicon overlying the field oxide 256 is etched away in this stage.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a bipolar junction transistor, comprising the following steps of:

(a) forming a first masking layer with an opening on a face of a substrate, said first masking layer including an intermediate masking portion surrounded by said opening and an outer masking portion;

(b) forming a second masking layer on said outer masking portion;

(c) ion implanting in said substrate a base region underlying said intermediate masking portion, and a base contact region underlying said opening;

(d) removing said second masking layer;

(e) forming an insulating region overlying said base contact region;

(f) removing said first masking layer;

(g) forming a doped conductive layer over the substrate; and (h) diffusing impurities within said conductive layer into said substrate to form an emitter region in said base region and to form a collector contact region, by using said insulating region as a mask.

2. A method as claimed in claim 1, wherein said step (c) comprises the steps of ion implantation with a first dose and a first energy to form said base region, and ion implantation with a second dose which is higher than said first dose and a second energy which is lower than said first energy to form said base contact region.

3. A method as claimed in claim 2, wherein the ion implantation for forming said base region uses boron ions with a dose of between about $2\times10^{12}$ to $2\times10^{14}$ atoms/cm$^2$ and an energy of between about 50 to 100 KeV; and wherein the ion implantation for forming said base contact region uses $BF_2$ ions with a dose greater than $1 \times 10^{15}$ atoms/cm$^2$ and an energy of between approximately 20 and 30 KeV.

4. A method as claimed in claim 2, wherein the ion implantation for said base region uses $BF_2$ ions with a dose of between approximately $2 \times 10^{12}$ and $2 \times 10^{14}$ atoms/cm$^2$ and an energy of between approximately 50 and 100 KeV; and wherein the ion implantation for said base contact region uses $BF_2$ ions with a dose greater than $1 \times 10^{15}$ atoms/cm$^2$ and an energy of between approximately 20 and 30 KeV.

5. A method as claimed in claim 2, wherein said base region has a junction depth shallower than said base contact region.

6. A method as claimed in claim 2, wherein said step (a) comprises the steps of forming by oxidation a pad oxide over said substrate; forming a silicon nitride over said pad oxide; and patterning said silicon nitride and pad oxide to complete said first masking layer.

7. A method as claimed in claim 6, wherein said pad oxide has a thickness of about 200–500 angstroms, and wherein said silicon nitride has a thickness of about 1000–2000 angstroms.

8. A method as claimed in claim 7, wherein said second masking layer is made from photoresist.

9. A method as claimed in claim 6, wherein said step (e) comprises the step of growing a field oxide in said opening of said first masking layer.

10. A method as claimed in claim 9, wherein said field oxide has a thickness of between about 5000 to 20000 angstroms.

11. A method as claimed in claim 2, wherein said doped conductive layer is made from polysilicon.

12. A method as claimed in claim 11, wherein said step (h) comprises the step of performing a rapid thermal annealing process to diffuse impurities from said polysilicon layer into the substrate regions which are not covered by said insulating region.

* * * * *